United States Patent
Li et al.

(10) Patent No.: US 10,418,447 B2
(45) Date of Patent: Sep. 17, 2019

(54) THIN FILM TRANSISTOR, PRODUCTION METHOD THEREOF, AND ELECTRONIC APPARATUS

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Guangyao Li, Beijing (CN); Guangcai Yuan, Beijing (CN); Dongfang Wang, Beijing (CN); Jun Wang, Beijing (CN); Qinghe Wang, Beijing (CN); Ning Liu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei (CN)

(*) Notice: Subject to any disclaimer, the term of this patent is extended or adjusted under 35 U.S.C. 154(b) by 0 days.

(21) Appl. No.: 15/940,043

(22) Filed: Mar. 29, 2018

(65) Prior Publication Data
US 2019/0131410 A1   May 2, 2019

(30) Foreign Application Priority Data
Oct. 27, 2017 (CN) .......................... 2017 1 1021725

(51) Int. Cl.
| | | |
|---|---|---|
| H01L 31/032 | (2006.01) | |
| H01L 29/24 | (2006.01) | |
| H01L 29/45 | (2006.01) | |
| H01L 29/49 | (2006.01) | |
| H01L 29/786 | (2006.01) | |
| H01L 21/445 | (2006.01) | |
| H01L 31/0392 | (2006.01) | |
| H01L 31/113 | (2006.01) | |

(Continued)

(52) U.S. Cl.
CPC ........ *H01L 29/24* (2013.01); *H01L 21/02568* (2013.01); *H01L 21/445* (2013.01); *H01L 27/1214* (2013.01); *H01L 27/1222* (2013.01); *H01L 27/283* (2013.01); *H01L 29/45* (2013.01); *H01L 29/4908* (2013.01); *H01L 29/66969* (2013.01); *H01L 29/78603* (2013.01); *H01L 29/78642* (2013.01); *H01L 29/78696* (2013.01); *H01L 29/84* (2013.01); *H01L 31/032* (2013.01); *H01L 31/03926* (2013.01); *H01L 31/1136* (2013.01); *H01L 29/786* (2013.01)

(58) Field of Classification Search
None
See application file for complete search history.

(56) References Cited

U.S. PATENT DOCUMENTS

| | | | |
|---|---|---|---|
| 2017/0261465 A1* | 9/2017 | Balijepalli, IV | ... G01N 27/4148 |
| 2017/0263726 A1* | 9/2017 | Huang | .............. G02F 1/134309 |

* cited by examiner

*Primary Examiner* — Minh Loan Tran
(74) *Attorney, Agent, or Firm* — Kinney & Lange, P.A.

(57) ABSTRACT

Provided is a thin film transistor, a production method thereof, and an electronic apparatus. The thin film transistor comprises a substrate, and a gate electrode, a gate insulator layer, a source electrode, a drain electrode and an active layer on the substrate, wherein the active layer comprises a stack of two or more layers of graphene-like two-dimensional semiconductor material. The electronic apparatus comprises the thin film transistor, and may be used as an optical or mechanical sensor.

17 Claims, 2 Drawing Sheets

(51) Int. Cl.
  *H01L 29/66* (2006.01)
  *H01L 21/02* (2006.01)
  *H01L 29/84* (2006.01)
  *H01L 27/12* (2006.01)
  *H01L 27/28* (2006.01)

THIN FILM TRANSISTOR, PRODUCTION METHOD THEREOF, AND ELECTRONIC APPARATUS

CROSS-REFERENCE TO RELATED APPLICATION(S)

This disclosure claims the priority of Chinese Patent Application No. 201711021725.9 filed on Oct. 27, 2017, entitled "THIN FILM TRANSISTOR, PRODUCTION METHOD THEREOF, AND ELECTRONIC APPARATUS", which is incorporated herein in its entirety by reference.

BACKGROUND

This disclosure relates generally to the technical field of semiconductor structures, and more particularly to a thin film transistor, a production method thereof, and an electronic apparatus.

Thin film transistors are widely used as a kind of power semiconductor devices, for example, in electronic products, such as TVs, panel displays, projector apparatuses, and the like. The electron mobility of a thin film transistor is an important parameter for evaluating the performance thereof. Thin film transistors mainly include amorphous silicon thin film transistors, organic thin film transistors, low-temperature polycrystalline silicon thin film transistors, etc. Among these, the organic thin film transistors and the low-temperature polycrystalline silicon thin film transistors are developed by modification on the basis of the traditional amorphous silicon thin film transistors and have higher electron mobilities. Therefore, a problem to be solved for a thin film transistor is how to improve the electron mobility.

SUMMARY

In one aspect, an example of this disclosure provides a thin film transistor, comprising a substrate, a gate electrode, a gate insulator layer, a source electrode, a drain electrode and an active layer, wherein the active layer comprises a stack of two or more layers of graphene-like two-dimensional semiconductor material.

Optionally, the gate electrode, the gate insulator layer, the source electrode, the active layer and the drain electrode are configured on the substrate in a stack in this order.

Optionally, the drain electrode, the active layer, the source electrode, the gate insulator layer and the gate electrode are configured on the substrate in a stack in this order.

Optionally, the gate electrode, the gate insulator layer and the active layer are configured on the substrate in this order, and the source electrode and the drain electrode are located in the same layer and configured apart on the active layer.

Optionally, the active layer, the gate insulator layer and the gate electrode are configured on the substrate in this order, and the source electrode and the drain electrode are located in the same layer and configured apart between the active layer and the gate insulator layer.

Optionally, the graphene-like two-dimensional semiconductor material in each of the two or more layers of graphene-like two-dimensional semiconductor material is independently selected from graphene-like two-dimensional molybdenum disulfide and graphene-like two-dimensional tungsten disulfide.

Optionally, the drain electrode is a grid structure consisting of orthogonally crossed nano silver wires.

Optionally, the source electrode and/or the gate electrode comprises graphene.

Optionally, the substrate is a flexible substrate.

In another aspect, examples of this disclosure provide an electronic apparatus, comprising any of the above-mentioned thin film transistors.

Optionally, the electronic apparatus is a sensor, and the sensor is such configured that the carrier concentrations in the two or more layers of graphene-like two-dimensional semiconductor material in the active layer vary as the environmental irradiation or pressure changes.

In another aspect, an example of this disclosure provides a production method of a thin film transistor. This method includes providing a substrate, and forming a gate electrode, a gate insulator layer, a source electrode, a drain electrode and an active layer on the substrate. The active layer comprises a stack of two or more layers of graphene-like two-dimensional semiconductor material.

Optionally, each layer in the two or more layers of graphene-like two-dimensional semiconductor material can be independently selected from graphene-like two-dimensional molybdenum disulfide and graphene-like two-dimensional tungsten disulfide.

Optionally, the drain electrode is formed by a screen printing process with a nano silver solution, and the drain electrode is a grid structure consisting of orthogonally crossed nano silver wires.

Optionally, the gate electrode and/or the source electrode is formed of graphene.

The present summary is provided only by way of example, and not limitation. Other aspects of the present disclosure will be appreciated in view of the entirety of the present disclosure, including the entire text, claims, and accompanying figures.

BRIEF DESCRIPTION OF THE DRAWINGS

The drawings herein are incorporated into the description and are one part of the description, illustrate examples in accordance with this disclosure, and are used together with the description to explain the principle of this disclosure.

BRIEF DESCRIPTION OF EMBODIMENTS

Figure 1:
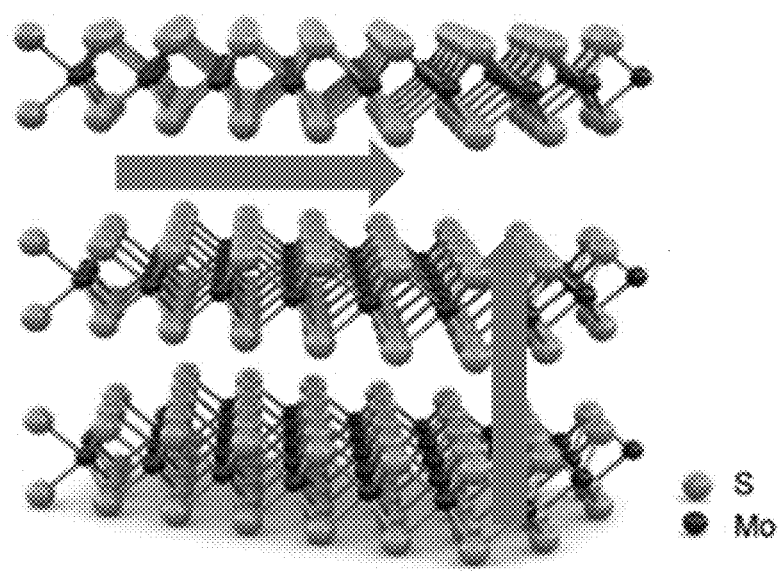
FIG. 1 is a schematic drawing of an atomic structure of graphene-like two-dimensional molybdenum disulfide according to an example of this disclosure.

Exemplary embodiments are herein described in detail. The examples are shown in the drawings. When the description below refers to the drawings, the same reference numeral in different figures represents the same or similar elements, unless indicated otherwise. The embodiments described in the examples below do not represent all embodiments in accordance with this disclosure. On the contrary, they are only examples of the apparatuses and methods that are consistent with some aspects of this disclosure as defined in details in the appended claims.

An example of this disclosure provides a thin film transistor (TFT), comprising an active layer, wherein the active layer comprises a stack of two or more layers of graphene-like two-dimensional semiconductor material. The film transistor also comprises a substrate, a gate electrode, a gate insulator layer, a source electrode and a drain electrode, which are needed.

Graphene-like two-dimensional material refers to a material that remains a nanometer scale of a thickness of one or a few atoms in one dimension, while having a two-dimensional honeycomb-like lattice structure similar to a structure consisting of 6-membered carbon rings, in a two-dimensional plane. Graphene-like two-dimensional material has specific properties, such as excellent heat conductivity and electrical conductivity, high specific surface area, and the like. This structure is similar to the structure of graphene.

Graphene-like two-dimensional semiconductor material refers to a material having characteristics of graphene-like two-dimensional material and having semiconductor properties. Particularly, the graphene-like two-dimensional semiconductor material may be configured by replacing some or all carbon atoms in graphene with corresponding atoms of substitute element(s), so that the conduction band and the valence band of graphene are separated apart to exhibit a band gap, thereby reducing the conductivity of the graphene and allowing it to exhibit properties of a semiconductor.

Specifically, graphene-like two-dimensional semiconductor material may be a compound of a transition metal and a chalcogen, sulfide of Group-III (-IV) metal, silicene, stanene, etc., which acts as a graphene-like two-dimensional semiconductor material by replacing some or all carbon atoms in graphene with substitute element(s).

In some examples, the graphene-like two-dimensional semiconductor material in this embodiment is, for example, graphene-like two-dimensional molybdenum disulfide ($MoS_2$), graphene-like two-dimensional tungsten disulfide ($WS_2$), or the like.

FIG. 1 is a schematic drawing of an atomic structure of graphene-like two-dimensional molybdenum disulfide provided by an example of this disclosure, in which three layers of graphene-like two-dimensional molybdenum disulfide are contained. As can be seen from FIG. 1, all carbon atoms in graphene have been replaced by sulfur (S) atoms and molybdenum (Mo) atoms, while the arrangement manner of the sulfur and molybdenum atoms is substantially the same as the arrangement manner of the carbon atoms in the original graphene. FIG. 1 merely shows the arrangement manner and structure of atoms in one of the graphene-like two-dimensional materials. There are other structures in practice, which are not limited in this disclosure.

Graphene-like two-dimensional semiconductor material may be used to produce the active layer in examples of this disclosure due to the semiconductor property thereof. Further, similar to graphene, graphene-like two-dimensional semiconductor material has good stability, flexibility and transparency. Therefore, the TFTs in the examples of this disclosure are applicable for flexible electronic apparatuses, such as wearable apparatuses.

In the TFTs in the examples of this disclosure, the active layer comprises two or more layers of graphene-like two-dimensional semiconductor material. Since there are multiple layers of graphene-like two-dimensional semiconductor material, carriers are not only generated in each layer of material per se, but also may be generated among the layers. For example, as shown in FIG. 1, carriers may be generated along the direction of the horizontal arrow in each layer of graphene-like two-dimensional molybdenum disulfide, while carriers may also be generated along the direction of the vertical arrow among the layers. Therefore, a relatively higher electron mobility may be achieved, so that the TFT has good electrical properties.

It should be noticed that the specific chemical structure of the graphene-like two-dimensional semiconductor material in examples of this disclosure is only used to explain this disclosure, but not used to limit this disclosure. Other structures that may achieve the technical solutions of this disclosure are also within the protection scope of this disclosure.

The TFTs in examples of this disclosure may have various types and structures. Examples of this disclosure will be further described in details below by referring to the drawings.

Figure 2:
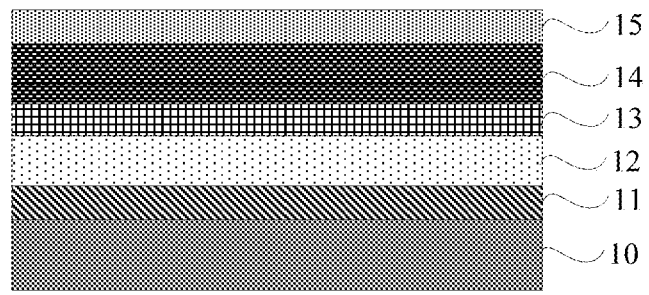
FIG. 2 is a schematic drawing of a structure of a thin film transistor according to an example of this disclosure.

FIG. 2 shows a TFT having one such structure. As shown in FIG. 2, the TFT comprises a substrate 10, and a gate electrode 11, a gate insulator layer 12, a source electrode 13, an active layer 14 (in this figure, active layer 14 exemplarily is a stack comprising three layers of graphene-like two-dimensional semiconductor material) and a drain electrode 15, which are configured on the substrate 10 in a stack in this order.

Figure 3:
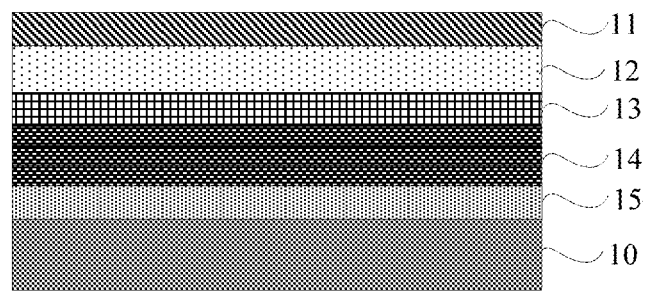
FIG. 3 is a schematic drawing of a structure of a thin film transistor according to another example of this disclosure.

FIG. 3 shows a TFT having another structure. As shown in FIG. 3, the TFT comprises a substrate 10, and a drain electrode 15, an active layer 14 (in this figure, active layer 14 exemplarily is a stack comprising three layers of graphene-like two-dimensional semiconductor material), a source electrode 13, a gate insulator layer 12 and a gate electrode 11, which are configured on the substrate 10 in a stack in this order.

The TFTs shown in FIG. 2 and FIG. 3 are two types of vertical thin film transistors, wherein the one shown in FIG. 2 is a bottom-gate thin film transistor, in which the gate electrode is located below the active layer, and the one shown in FIG. 3 is a top-gate thin film transistor, in which the gate electrode is located above the active layer. In both types of the TFTs, various layers are configured in a stack. The thickness of the active layer is the width of the conductive channel. By means of increasing the thickness of the active layer, the ratio of the width to the length of the conductive channel may be increased, and the TFT would have a greater on-state current and a lower cut-in voltage. Thus, the power consumption of the electronic apparatus using these TFTs may be decreased. In particular, the TFTs are applicable in electronic apparatuses requiring high power consumption. For example, the TFTs may be used as the transistors in wearable apparatuses, artificial intelligence apparatuses, biomimetic robots, etc. Additionally, for production of a single TFT, what is needed is only forming the materials of various layers on a substrate sequentially. A patterning process for forming a conductive channel between the source electrode layer and the drain electrode layer is not necessary. Therefore, the production costs of these TFTs may be spared.

Figure 4:
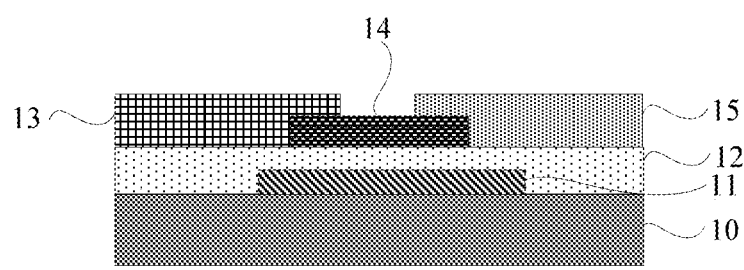
FIG. 4 is a schematic drawing of a structure of a thin film transistor according to still another example of this disclosure.

FIG. 4 shows a TFT having still another structure. As shown in FIG. 4, the TFT comprises
a substrate 10, and a gate electrode 11, a gate insulator layer 12 and an active layer 14, which are configured on the substrate in this order. Further, the source electrode 13 and the drain electrode 15 are located in the same layer and configured apart on the active layer 14.

Figure 5:
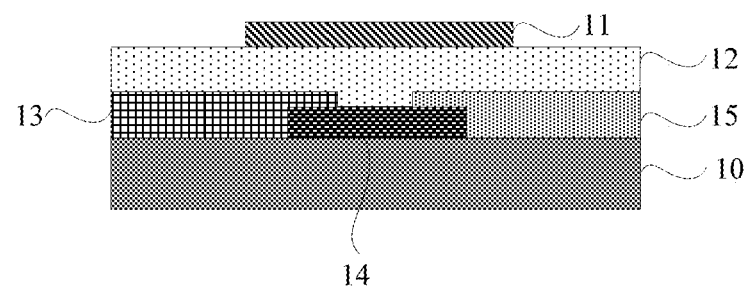
FIG. 5 is a schematic drawing of a structure of a thin film transistor according to further another example of this disclosure.

FIG. 5 shows a TFT having further another structure. As shown in FIG. 5, the TFT comprises
a substrate 10, and an active layer 14, a gate insulator layer 12 and a gate electrode 11 on the substrate in this order. Further, the source electrode 13 and the drain electrode 15 are located in the same layer and configured apart between the active layer 14 and the gate insulator layer 12.

The TFTs shown in FIG. 4 and FIG. 5 are two types of traditional thin film transistors, wherein the one shown in FIG. 4 is a bottom-gate thin film transistor, in which the gate electrode is located below the active layer, and the one shown in FIG. 5 is a top-gate thin film transistor, in which the gate electrode is located above the active layer. In both types of the TFTs, the interval between the source electrode and the drain electrode is the conductive channel. These TFTs are traditional types of thin film transistors, and are useful particularly as switching transistors in displays.

The various types of TFTs mentioned above are only representative embodiments of this disclosure. The structures of the TFTs of this disclosure are not limited thereto. Since the active layer comprises multiple layers of graphene-like two-dimensional semiconductor material, which is sensitive to the light and pressure, when the environmental irradiation or pressure is applied thereon, the carrier concentrations in individual layers and among layers will vary. Therefore, the pressure or environmental irradiation applied on the TFT may be detected by detecting the current intensity between the source electrode and the drain electrode when applying a voltage on the gate electrode. It may be used as an optical or mechanical sensor device. Further, since there are multiple layers of graphene-like two-dimensional semiconductor material, when different environmental irradiation intensities or different pressures are applied, the variations of the carrier concentrations in individual layers and among layers may be accumulated. Therefore, the variations of the currents between the source electrode and the drain electrode are significantly different. By means of comparing the difference of the variations of the currents, which are caused by the carrier mobility variations in individual layers and among layers due to the changes of the environmental irradiation, pressure, or the like, the changes of the environmental irradiation and pressure may be detected more precisely. When the TFT is used as an optical or mechanical sensor device, it exhibits good sensitivity.

It should be noticed that in the examples above, the material of each layer in the active layer comprising a stack of multiple layers of graphene-like two-dimensional semiconductor material may be the same. For example, each layer of the active layer is graphene-like two-dimensional molybdenum disulfide ($MoS_2$), graphene-like two-dimensional tungsten disulfide ($WS_2$), or the like. Optionally, the materials of the layers in the active layer are different. For example, among these, one layer is graphene-like two-dimensional molybdenum disulfide ($MoS_2$), another layer is graphene-like two-dimensional tungsten disulfide ($WS_2$), and further another layer is another graphene-like two-dimensional semiconductor material. Optionally, the materials of adjacent layers in the active layer are different. For example, the active layer comprises a stack of multiple layers of graphene-like two-dimensional molybdenum disulfide ($MoS_2$) and graphene-like two-dimensional tungsten disulfide ($WS_2$) provided alternatively.

In the active layers in the various types of layer structures mentioned above, the amounts and the types of the carriers generated in individual layers or among layers may be different, since the materials are different. Hence, for TFTs comprising different active layers, the electron mobilities thereof may also be different. In practice, the specific materials in individual layers in the active layer may be selected according to various requirements and are not limited in this disclosure.

In an optional embodiment, the drain electrode is a grid structure consisting of orthogonally crossed nano silver wires.

In this embodiment, the drain electrode is made of nano silver material, which has low resistivity, good electric conductivity, and also has characteristics, such as excellent light transmittance and excellent bending-resistant flexibility. When it is used as the material of the drain electrode of a TFT, it enables the TFT to be used in flexible apparatuses, for example, in electronic apparatuses, such as wearable apparatuses, display apparatuses with a curved surface, flexible display apparatuses, or the like. The drain electrode using nano silver material may be prepared by a screen printing method, in which the production process is simple, no high-temperature process is needed, and the production is suitable on a flexible substrate. Further, the drain electrode has a network structure. Drain electrode structures with different resistivities may be obtained by controlling the thickness of the nano silver wires and the distances between the wires in the network during the production. When the other configuration is the same, the currents between the source electrode and the drain electrode may be different, so that TFTs with different sensitivities and power consumptions may be obtained, thereby further enlarging the application range of the TFTs.

In some examples, the source electrode and/or the gate electrode comprises graphene.

Graphene is an ultrathin material. When graphene is used in the drain electrode and the gate electrode, the total thickness of the TFT device may be reduced significantly, so as to reduce the size of the TFT device. Ultrathin TFTs and TFT devices having nano sizes may be produced. These TFT devices may be used in the fields of wearable apparatuses, optical detectors, artificial intelligence apparatuses, and the like, which need to be ultrathin and light, has low power consumption and high flexibility. Therefore, these TFTs are appropriate in the electronic apparatuses having high requirement on the size of the device, such as wearable apparatuses, wearable apparatuses, artificial intelligence apparatuses, and biomimetic robots.

Further, since grapheme is used by the source electrode, when the voltage is applied to the gate electrode of the TFT, a few electrons will enter the active layer from graphene. Thus, the carrier concentration will be further increased, so as to improve the electron mobility of the TFT.

In some examples, the substrate in the TFT mentioned above may be a flexible substrate. For example, materials, such as plastics or resins, may be used as the materials for the flexible substrate. In particular, the material may be, for example, PDMS (polydimethylsiloxane), etc.

Use of a flexible substrate allows the TFT being suitable for electronic apparatuses, such as wearable apparatuses, artificial intelligence apparatuses, display apparatuses with a curved surface, flexible display apparatuses, or the like.

Examples of this disclosure also provide an electronic apparatus, which comprises the thin film transistor in any of the examples mentioned above.

The electronic apparatuses in the examples of this disclosure may be various kinds of apparatuses. The electronic apparatus may be products or components that have the function of display, such as electronic paper, cellphones, tablet PCs, TVs, notebook PCs, digital frames, navigators, and the like. The electronic apparatus also may be an optical or mechanical sensor, which may be used in an electronic apparatus requiring an optical or mechanical sensor, for example, electronic apparatus in vehicles, biomimetic robots, artificial intelligence apparatuses, and the like.

In the optical or mechanical sensor of this disclosure, in the stack of two or more layers of graphene-like two-dimensional semiconductor material, the carrier concentrations in the individual layers vary by the influence of the change of the environmental irradiation or pressure. The variations of the carrier concentrations affect not only the conductivity in a layer, but also the conductivity among layers in the stack. The optical or mechanical sensor of this disclosure may achieve sensing at a higher sensitivity by taking the variation of the conductivity among layers into consideration.

Examples of this disclosure also provides a production method of a thin film transistor, comprising providing a substrate; forming a gate electrode, a gate insulator layer, a source electrode, a drain electrode and an active layer on the substrate; wherein the active layer comprises a stack of two or more layers of graphene-like two-dimensional semiconductor material.

In these examples, the substrate may be a flexible substrate (e.g. a substrate of PDMS) or a rigid substrate (e.g. a substrate of glass). Two or more layers of graphene-like two-dimensional semiconductor material may be formed on the substrate by various methods, such as Chemical Vapor Deposition (CVD), Plasma Enhanced Chemical Vapor Deposition (PECVD), or Rapid Thermal CVD (RTCVD). If one or more TFTs are to be produced in a specific region of the substrate, a patterning process may be used to pattern the formed two or more layers of graphene-like two-dimensional semiconductor, to obtain the active layer of the TFT, wherein the patterning process may include, but is not limited to, applying a photoresist, exposing, developing, etching, peeling the photoresist off, etc.

The graphene-like two-dimensional semiconductor material mentioned above may be, for example, graphene-like two-dimensional molybdenum disulfide, graphene-like two-dimensional tungsten disulfide, or the like.

In the TFTs in these examples, since the active layer thereof comprises multiple layers of graphene-like two-dimensional semiconductor material, carriers are not only generated in each layer of material per se, but also may be generated among the layers. Therefore, relatively higher electron mobility may be achieved, so that the TFT has good electrical properties.

In some examples, the TFT further comprises a gate electrode, a gate insulator layer, a source electrode and a drain electrode. The TFT may further comprise a substrate, which is a support for the above-mentioned layers. Thus, the production method also comprises providing a substrate, forming a gate electrode, a gate insulator layer, a source electrode and a drain electrode on the substrate, and forming an active layer, including forming the active layer on the substrate.

The TFTs in the examples of this disclosure may have various types and structures. In the above-mentioned FIG. 2 to FIG. 5, four different types of specific structures of the TFTs are illustrated. The TFTs having respective structure may be produced by known processes, as explained sequentially below.

For production of the vertical thin film transistors shown in FIG. 2 and FIG. 3, since the TFT has a stack structure of layers, the structure of the TFT may be formed by forming the individual material layers on the substrate sequentially. For example, when a bottom-gate TFT is to be produced, the TFT structure may be formed by forming a gate electrode material layer, a gate insulator layer material layer, a source electrode material layer, an active layer material layer and a drain electrode material layer.

If one or more TFTs are to be produced in a specific region of the substrate, a one-time patterning process may be used to pattern the material layers, to form the structure of the TFT in the specific region. Specifically, a photoresist is formed on the material layer at the most top, then the photoresist is subjected to exposure and development by a mask plate to form the desired photoresist pattern. The photoresist pattern comprises a photoresist-remained area and a photoresist-removed area. The photoresist-remained area corresponds to the region requiring the TFT, while the photoresist-removed area corresponds to the other region. Then, the material layers in the photoresist-removed area are etched, to remove the material layers. At last, the photoresist in the photoresist-remained area is peeled off. Finally, one or more TFTs are formed in the specific region.

As can be known from the production method mentioned above, the TFT structure may be formed in the specific region by a one-time patterning process. The production method is simple, and thus the production costs of the TFT may be spared.

For production of the traditional thin film transistors shown in FIG. 4 and FIG. 5, the structures of each layers of the TFT may be formed by several patterning processes. This is explained by producing the bottom-gate TFT shown in FIG. 4 as an example.

Firstly, the gate electrode material layer is formed on the substrate. Then, the gate electrode material layer is patterned by a patterning process, for example, including exposure, development and etching, to form the gate electrode.

Next, the gate insulator layer material layer is formed on the gate electrode. Patterning is not required for this layer.

Next, at least two graphene-like two-dimensional semiconductor material layers are formed on the gate insulator layer. Then, the multi-layered material layer is patterned by a patterning process, for example, including exposure, development and etching, to form the active layer.

Finally, the source electrode material layer and drain electrode material layer are formed on the active layer. The source electrode and the drain electrode may use the same material. Then, the source electrode and drain electrode material layers are patterned by a patterning process, for example, including exposure, development and etching, to form the source electrode and the drain electrode.

As can be known from the above description, the TFT structure may be formed by three patterning processes. If a top-gate TFT is to be formed as shown in FIG. 5, it may be formed similar to the above-mentioned steps, except that the order of forming the layers is different from that for the bottom-gate TFT. The detailed description is omitted here.

In an optional embodiment, the drain electrode may be formed by a screen printing process with a nano silver solution, and the drain electrode is a grid structure consisting of orthogonally crossed nano silver wires.

In this embodiment, the drain electrode is formed by a screen printing process. By using a screen printing plate, the nano silver solution may pass the holes on the screen printing plate by a pressure, so as to form the drain electrode on the substrate having the network structure. The production method using the screen printing process is simple, with low production costs, and does not need a high-temperature process. Therefore, the production is particularly suitable on a flexible substrate. Further, the drain electrode has a network structure. Drain electrode structures with different resistivities may be obtained by controlling the thickness of the nano silver wires and the distances between the wires in the network during the production.

In some examples, the gate electrode and/or source electrode is formed of graphene. For forming graphene on the substrate, the mechanical exfoliation method, the oxidation-reduction method, the epitaxial growth method, or the chemical vapor deposition method, or the like may be used specifically.

Since graphene is an ultrathin material, when graphene is used in the drain electrode and the gate electrode, the total thickness of the TFT device may be reduced significantly, so as to reduce the size of the TFT device. Ultrathin TFTs and TFT devices having nano sizes may be produced. Therefore, these TFTs are appropriate in the electronic apparatuses having high requirement on the size of the device, such as wearable apparatuses, wearable apparatuses, artificial intelligence apparatuses, and biomimetic robots.

It should be noticed that the above-mentioned materials for forming the gate electrode, the source electrode and the drain electrode may also be selected from other conductive materials, for example, metal materials or metal alloy materials. The above-mentioned materials for forming the gate insulator layer may also be various, for example, alumina ($Al_2O_3$), silicon nitride (SiN), or the like, which are not limited in this disclosure.

It should be noticed that the sizes of the layers and regions in the drawings may be exaggerated for clarity of the drawings. Further, it should be understood that when an element or layer is described as "above" another element or layer, it may be directly on the other element or layer, or there may be one or more intermediate layers or elements. Further, it should be understood that when an element or layer is described as "below" another element or layer, it may be directly under the other element or layer, or there may be one or more intermediate layers or elements. Additionally, it should also be understood that when an element or layer is described as "between" two layers or two elements, it may be the only one between said two layers or two elements, or there may be one or more intermediate layers or elements. Similar Reference numerals indicate similar elements throughout this disclosure.

In view of this specification and after practicing this disclosure, a person skilled in the art may envisage other embodiments of this disclosure easily. This disclosure intends to involve any variation, application, or adaptive modification of this disclosure. These variations, applications, or adaptive modifications comply with the general principle of this disclosure and include well known general knowledge or technical features in the art, which are not disclosed in this disclosure. The description and examples are only exemplary. The true scope and spirit of this disclosure are defined by the claims.

The invention claimed is:

1. A thin film transistor comprising:
a substrate, a gate electrode, a gate insulator layer, a source electrode, a drain electrode, and an active layer,
wherein the active layer comprises a stack of two or more layers of graphene-like two-dimensional semiconductor material, and
wherein the drain electrode is a grid structure consisting of orthogonally crossed nano silver wires.

2. The thin film transistor according to claim 1, wherein the gate electrode, the gate insulator layer, the source electrode, the active layer, and the drain electrode are configured on the substrate in a stack in this order.

3. The thin film transistor according to claim 1, wherein the drain electrode, the active layer, the source electrode, the gate insulator layer, and the gate electrode are configured on the substrate in a stack in this order.

4. The thin film transistor according to claim 1, wherein:
the gate electrode, the gate insulator layer, and the active layer are configured on the substrate in this order; and
the source electrode and the drain electrode are located in the same layer and configured apart on the active layer.

5. The thin film transistor according to claim 1, wherein:
the active layer, the gate insulator layer, and the gate electrode are configured on the substrate in this order; and
the source electrode and the drain electrode are located in the same layer and configured apart between the active layer and the gate insulator layer.

6. The thin film transistor according to claim 1, wherein the graphene-like two-dimensional semiconductor material in each of the two or more layers of graphene-like two-dimensional semiconductor material is independently selected from graphene-like two-dimensional molybdenum disulfide and graphene-like two-dimensional tungsten disulfide.

7. The thin film transistor according to claim 1, wherein the substrate is a flexible substrate.

8. An electronic apparatus, comprising the thin film transistor according to claim 1.

9. The electronic apparatus according to claim 8, wherein the electronic apparatus is a sensor, and the sensor is such configured that the carrier concentrations in the two or more layers of graphene-like two-dimensional semiconductor material in the active layer vary as the environmental irradiation or pressure changes.

10. A thin film transistor, comprising:
a substrate, a gate electrode a gate insulator layer, a source electrode, a drain electrode and an active layer, wherein the active layer comprises a stack of two or more layers of graphene-like two dimensional semiconductor material, wherein the source electrode and/or the gate electrode comprises graphene.

11. The thin film transistor according to claim 10, wherein the graphene-like two-dimensional semi-conductor material in each of the two or more layers of graphene-like two-dimensional semiconductor material is independently selected from graphene-like two-dimensional molybdenum disulfide and graphene-like two-dimensional tungsten disulfide.

12. The thin film transistor according to claim 10, wherein the substrate is a flexible substrate.

13. An electronic apparatus, comprising the thin film transistor according to claim 10.

14. The electronic apparatus according to claim 13, wherein the electronic apparatus is a sensor, and the sensor is such configured that the carrier concentrations in the two or more layers of graphene-like two-dimensional semiconductor material in the active layer vary as the environmental irradiation or pressure changes.

15. A production method of a thin film transistor, the production method comprising:
providing a substrate;
forming a gate electrode, a gate insulator layer, a source electrode, a drain electrode, and an active layer on the substrate,
wherein the active layer comprises a stack of two or more layers of graphene-like two-dimensional semiconductor material,
wherein the drain electrode is formed by a screen printing process with a nano silver solution, and the drain electrode is a grid structure consisting of orthogonally crossed nano silver wires.

16. The method according to claim 15, wherein each layer in the two or more layers of graphene-like two-dimensional semiconductor material is independently selected from graphene-like two-dimensional molybdenum disulfide and graphene-like two-dimensional tungsten disulfide.

17. The method according to claim 15, wherein the gate electrode and/or the source electrode is formed of graphene.

* * * * *